United States Patent [19]

Weilbacker

[11] 4,417,336

[45] Nov. 22, 1983

[54] METHOD OF TESTING WITH COMPUTERS

[75] Inventor: Thomas O. Weilbacker, Northvale, N.J.

[73] Assignee: The Bendix Corporation, Teterboro, N.J.

[21] Appl. No.: 274,952

[22] Filed: Jun. 18, 1981

[51] Int. Cl.³ ............................................. G01R 31/28
[52] U.S. Cl. ..................................... 371/20; 364/580; 364/900
[58] Field of Search .......... 371/20; 324/73 R, 73 AT; 364/580, 900

[56] References Cited

U.S. PATENT DOCUMENTS

| | | | |
|---|---|---|---|
| 4,012,625 | 3/1977 | Bowen et al. | 371/20 |
| 4,168,527 | 9/1979 | Winkler | 364/580 |
| 4,168,796 | 9/1979 | Fulks et al. | 371/20 |
| 4,308,615 | 12/1981 | Koegel et al. | 371/20 |
| 4,348,760 | 9/1982 | Rice et al. | 371/20 |

OTHER PUBLICATIONS

S. J. Ring, A Distributed Intelligence Automatic Test System for Patroit, IEEE Trans. on Aerospace and Electronic Systems, vol. AES-13, No. 3, May 1977, pp. 264–272.

Primary Examiner—Charles E. Atkinson
Attorney, Agent, or Firm—Anthony F. Cuoco; Thomas L. Adams

[57] ABSTRACT

In this method, a unit (24) is tested by a test instrument (22) with the aid of a master (MC), an intermediate (30) and a slave (SL) computer. The latter connects to the test instrument (22) for sensing its measurements. The method includes the step of dispatching one of a plurality of instruction signals to the intermediate computer (30) from the master computer (MC). Another step is issuing to the slave computer (SL), when it is not halted, a signal to halt from the intermediate computer (30) after receipt by the intermediate computer (30) of one of the instruction signals. Another step is transmitting from the intermediate (30) to the slave (SL) computer, after the latter has halted, that one of a plurality of command signals corresponding to the currently dispatched one of the instruction signals. The method also includes the step of forwarding a go signal to the intermediate computer (30) from the master computer (MC) and issuing to the slave computer (SL) from the intermediate computer (30) a run signal signifying a request to run and sense measurements from the test instrument (22).

12 Claims, 3 Drawing Figures

METHOD OF TESTING WITH COMPUTERS

BACKGROUND OF THE INVENTION

The present invention relates to computerized testing and, in particular, to controlling a slave computer by a master computer.

It is known to connect computers on a common bus so that they can communicate with each other. Such equipment typically includes interfacing electronics to allow transfer of information without interference with the respective operations of each computer. It is also known to employ a computer to operate and read measurements of test equipment thereby performing a series of tests on a unit. A problem with a computer of the latter type is that since it is often a local, trouble-shooting, shop device, it does not have a full range of peripherals that allow easy reprogramming and debugging when such becomes necessary. Such a shop-level computer may require extensive programming and debugging. Since it is often performed by operating many separate bit switches and by observing responses on a line printer or similar print out device, this reprogramming takes much time.

An important consideration when interfacing computers is determining the priority and the manner in which instructions are handled as well as the manner and sequence in which various competing subroutines are initiated. Care must be taken that a command issuing from one computer does not conflict with the overriding requirements of the other computer.

Therefore, there is a need for a method for coordinating the operation of computers in a simple and efficient manner.

SUMMARY OF THE INVENTION

In accordance with the illustrative embodiment demonstrating features and advantages of the present invention, there is provided a method of testing a unit with a test instrument and with the aid of a master, an intermediate and a slave computer. The latter is connected to the test instrument for sensing its measurements. The method includes the step of dispatching one of a plurality of instruction signals to the intermediate computer from the master computer. The method also includes the step of issuing to the slave computer, when it is not halted, a signal to halt from the intermediate computer after receipt by the latter of one of the instruction signals. The method also includes the step of transmitting from the intermediate to the slave computer, after the latter has halted, that one of a plurality of command signals corresponding to the currently received one of the instruction signals. The method further includes the step of forwarding a go signal to the intermediate computer from the master computer and issuing to the slave computer from the intermediate computer a run signal signifying a request to run and sense measurements from the test instrument.

By employing techniques according to the above teachings, an intermediate computer can act as a liaison between a master and a slave computer. The intermediate computer initially receives instructions from the master and relays them to the slave to control its operation. However, before issuing an operational command to the slave, the intermediate computer first acts to halt the slave. This ensures that the slave will not be interrupted during a critical phase of its cycle where important information may be lost.

In a preferred embodiment, the intermediate computer can handle various types of commands after the slave has halted. The intermediate computer can command the slave to return information in specified memory locations or in specified registers. The intermediate computer on receipt of this information can relay this information back to the master computer for display. Also, the intermediate computer can require the slave to alter the contents of its memory at specified locations. Additionally, in the preferred embodiment the intermediate computer can command the slave to operate specified instruments under its control and relay measurements obtained in this fashion back to the intermediate computer for eventual retransmission to the master computer. Moreover, the intermediate computer can command the slave computer to execute a single programming step or to execute a series of programming steps until reaching a specified step. This latter feature is a substantial aid when troubleshooting a program being run by the slave computer.

Preferably, the intermediate computer is a microcomputer which is dedicated primarily to transferring commands and other data between the master and slave computer. In this preferred embodiment, the slave computer can be located at a significant distance from the master computer which can be controlling one or more slave computers.

BRIEF DESCRIPTION OF THE DRAWINGS

The above brief description as well as other objects, features and advantages of the present invention will be more fully appreciated by reference to the following detailed description of a presently preferred but nonetheless illustrative embodiment in accordance with the present invention when taken in conjunction with the accompanying drawings wherein.

DETAILED DESCRIPTION OF THE PREFERRED EMBODIMENT

Figures 1, 2:
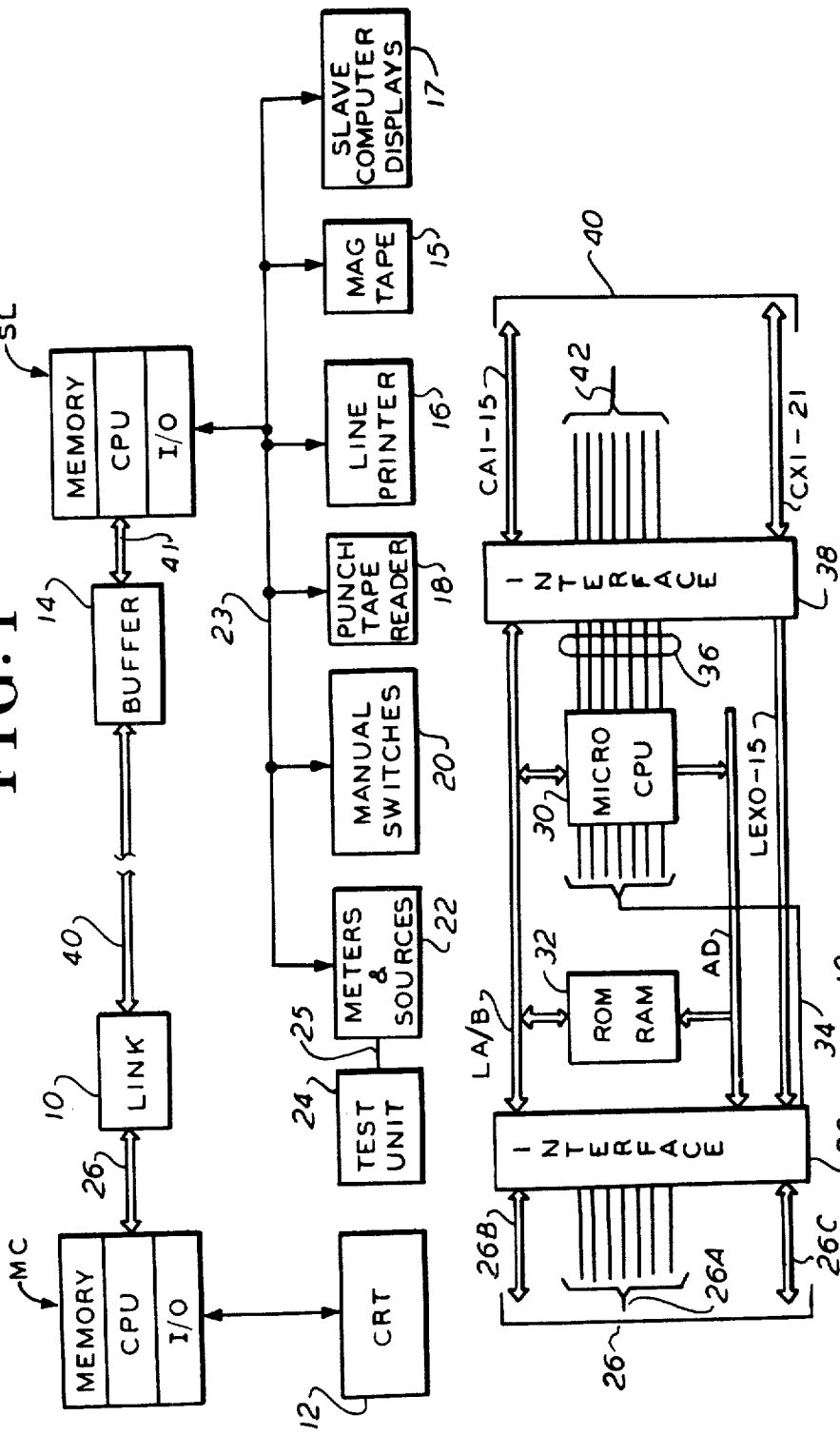
FIG. 1 is a block diagram of a master and slave computer linked by an intermediate computer according to the present invention.
FIG. 2 is a more detailed block diagram of the link of FIG. 1.

Referring to FIG. 1, link 10, containing an intermediate computer, is connected to master computer MC by a plurality of lines 26. Computer MC is a general-purpose computer including as illustrated: data memory, a central processing unit (CPU) and an input/output port (I/O). Master computer MC is shown connected to a display device, in this embodiment, cathode ray tube 12.

Link 10 is arranged to exchange data between master computer MC and slave computer SL. Since slave computer SL is located at a significant distance from link 10 a relatively long cable 40 comprising a plurality of lines connects between link 10 and buffer 14. Buffer 14 employs transmitting and receiving devices for restoring the signal levels that may be attenuated through cable 40. Buffer 14 is shown connecting directly to slave computer SL through a plurality of lines, whose signals correspond to the information on cable 40. Slave computer SL is shown with a slave memory having a plurality of memory cells, a central processing unit (CPU) and an input/output port (I/O). Slave computer SL is shown connected through its input/output port and lines 23 to a plurality of peripherals. Four such peripherals connected to it are conventional line printer 16, punch tape reader 18, magnetic tape memory 15 and computer displays 17. Also connected in this fashion is a manual programmer shown herein as plurality of manual switches 20, one for each relevant bit. Switches 20 can be used to transmit a data work to slave computer SL for the purpose of controlling programming, reprogramming or debugging programs of slave computer SL. Also connected by lines 23 to slave computer SL is an instrument comprising measuring devices and stimulative devices 22. These measuring instruments may include voltmeters, frequency counters, ammeters, etc. These instruments can be operated by the signals transmitted on lines 23 by slave computer SL to cause instruments 22 to relay back on lines 23 operating parameters measured by them. Instruments 22 connect to a unit under test 24 through a test terminal shown herein as interconnecting lines 25. The stimulating devices in block 22 may include current sources and voltage sources of various types to supply by connector pins or probes in lines 25 stimulating signals to test the performance of unit 24.

Referring to FIG. 2, a more detailed block diagram is given of link 10 of FIG. 1. Previously mentioned lines 26, shown composed of control lines 26A and information lines 26B and 26C, connect to a master interface means 28. Interface 28 may employ a group of registers, flip-flops or other sequential or combinational logic circuits to render lines 26 compatible with the balance of the circuitry shown in FIG. 2. In certain simplified, highly compatible embodiments, interface 28 may be a series of directly wired connections. Interface 28 also connects to a group of intercommunication lines LA/B, a group of intermediate lines 34 and a group of address lines AD. Lines LA/B may carry ordinary data while lines 34 may convey control signals such as halt and interrupt signals.

An intermediate computer, shown herein as processor 30, connects between data lines LA/B and address lines AD to exchange data with them. In this embodiment, processor 30 is a conventional microprocessor, whose structure and manner of operation is so well-known it need not be retold herein. Processor 30 also includes a memory, shown herein as a random access and read only memory group 32 connected to data lines LA/B to exchange data therewith and to address lines AD to receive addresses therefrom. Thus arranged, elements 30 and 32 can act as an intermediate microcomputer. Microcomputer 30 is connected to intermediate lines 34 and also to command lines 36 which connect to slave interface 38. Interface 38 is similar to interface 28 in that it employs various shift registers, flip-flops or other sequential or combinational logic to render lines LA/B, 36 and LEXO-15 compatible with lines 40. Interface 38 connects to data lines LEXO-15 to transmit data along these lines to interface 28. Lines 40 emerging from interface 38 comprise a group of informational lines CA1-15 and CX1-21 of slave computer SL (FIG. 1). Lines 40 also include a group of control lines 42 associated with the slave computer.

The equipment of FIG. 2 can be generally programmed by storing the desired instructions into memory 32 so that data and instructions from the master computer transmitted along lines 26 are received, translated and relayed by microprocessor 30 through interface 38 and lines 40 to control the slave computer in an orderly manner to be described hereinafter.

To facilitate an understanding of the principles associated with the apparatus of FIGS. 1 and 2, its operation will now be briefly described. A unit under test 24 is initially connected through lines 25, to the measuring and stimulating devices 22. Before starting, if desired, programming instructions can be fed into slave computer SL by operating tape reader 18 or by actuating manual switches 20 to transmit individual programming words. In this mode, slave computer SL can through line printer 16 or display 17 transmit acknowledging responses, inquiries and error signals. However, it is usually simpler for master computer MC to transmit programming information through link 10 and buffer 14.

Because master computer MC is, in this embodiment, a large, general-purpose computer employing many interactive devices such as cathode ray tube 12, initial programming and debugging can be performed more simply and rapidly by dispatching programming instructions from master computer MC. A keyboard associated with cathode ray tube 12 can be used to assemble instructions while its video screen displays the program, as well as programming errors. Master computer MC transmits this program over lines 26 through interface 28 (FIG. 2). Microcomputer 30 then sends corresponding control signals on lines 34 and address signals on lines AD directing the transmittal of this program along lines LA/B and into memory 32. Subsequently, the program is retransmitted on lines LA/B through interface 38 onto lines CX1-21 to program slave computer SL (FIG. 1).

Figure 3:
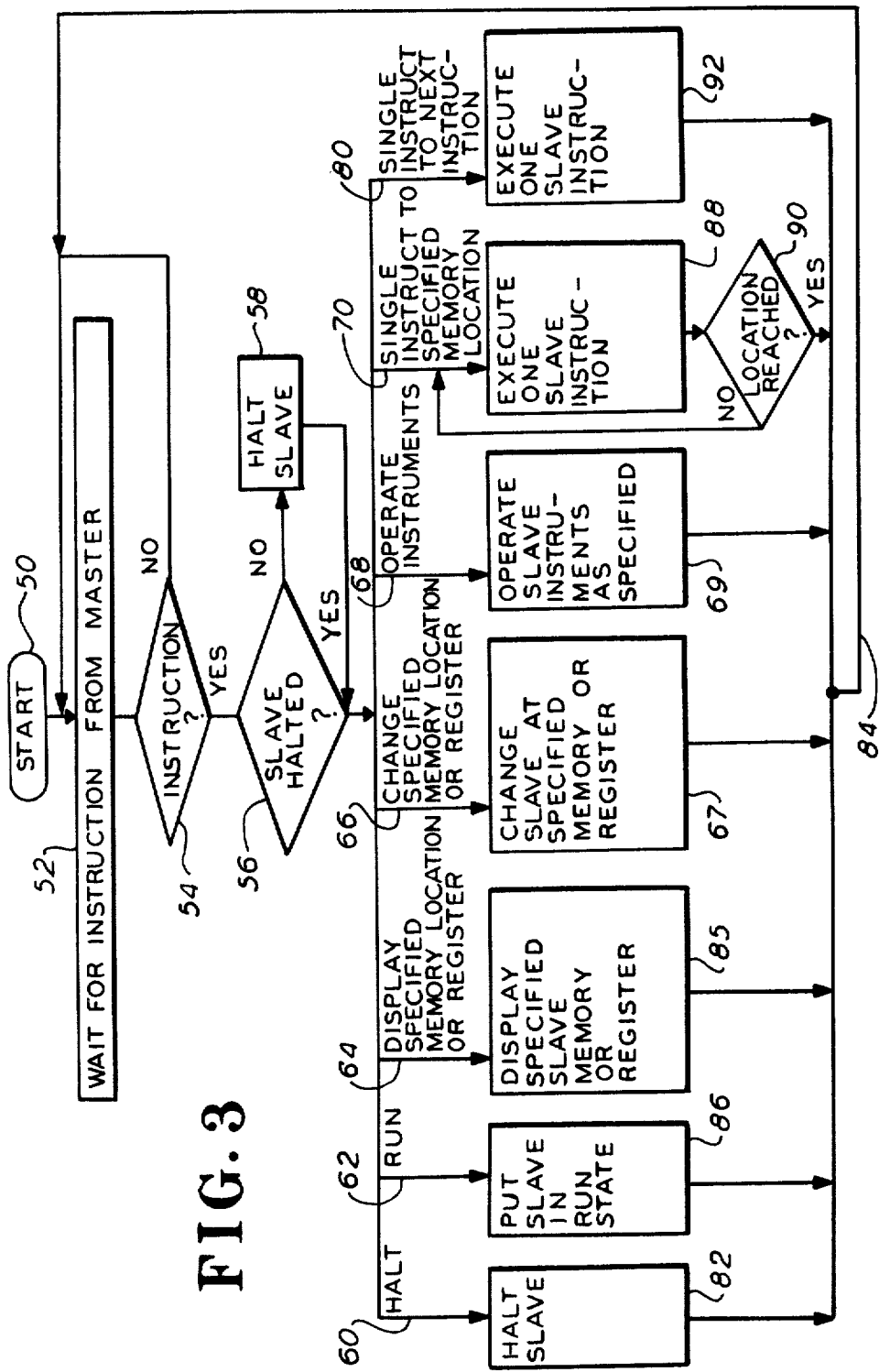
FIG. 3 is a flowchart for the system of FIG. 1.

The manner in which intermediate computer 30 handles communications between master computer MC and slave computer SL is illustrated by the flowchart of FIG. 3 showing the sequence of operations performed by intermediate computer 30 (FIGS. 1 and 2). The program starting from step 50 transfers to step 52 where intermediate computer 30 awaits an instruction from master computer MC. When the next signal is received, intermediate computer 30 transfers to conditional step 54 where it determines whether the recently received signal is an instruction from master computer MC. If it is not, the program returns to previously mentioned step 52. If, however, the last signal was an instruction from the master computer then intermediate computer 30 transfers to conditional step 56 and inquiries whether slave computer SL is halted. If the slave is not halted, step 58 is executed whereby a halt instruction is issued to the slave computer (otherwise this step is skipped). At this point, the instruction received from the master computer can initiate any one of the six illustrated subroutines: branch 60, 62, 64, 66, 68, 70 or 80. In the event that the instruction received from the master computer is merely a command to halt the slave, the program enters branch 60, verifies at step 82 that the slave computer is halted and returns along trunk line 84 to step 52 where further instructions are awaited.

Alternatively, the instructions from the master computer may direct the intermediate computer into branch 62 where step 86 is executed. In step 86, intermediate computer 30 issues a command to the slave computer SL through interface 38 (FIG. 2) and buffer 14 (FIG. 1) commanding slave computer SL to execute completely its programming steps. After such a command, the intermediate computer returns through branch 84 to step 52 and awaits further instructions.

Another routine which may be performed by intermediate computer 30 is shown as branch 64 where in step 85 the intermediate computer 30 transmits an order through interface 38 (FIG. 2) and buffer 14 (FIG. 1) to slave computer SL requesting that the contents of its memory at a specified location or at a specified register is read and relayed onto data lines CX1-21 (FIG. 2). Microcomputer 30 then retransmits this data along interface 28 and lines 26 to master computer MC. Master computer MC may use its display 12 to show the data transmitted. After this routine, intermediate computer 30 returns through branch 84 to step 52 and awaits further instructions.

Another routine executable by intermediate computer 30 is indicated as branch 66 and step 67. If master computer MC requires it, intermediate computer 30 sends a memory change instruction through interface 38 (FIG. 2) and buffer 14 (FIG. 1) to the slave. Slave computer SL responds by changing the data stored in a specified memory location or in a specified register. After ordering this operation, intermediate computer 30 returns to step 52 and awaits further instructions.

Another routine which may be ordered by the master computer MC is shown as branch 68 and step 69. In this routine, intermediate computer 30 transmits an order through interface 38 and buffer 14 to slave computer SL (FIG. 1) requiring it to operate one of the instruments 22. If so ordered, a specified current or voltage source can be actuated to apply a stimulus through lines 25 to unit 24. Alternatively, a measuring device such as a voltmeter, ammeter, frequency meter, etc. may be operated and caused to relay through lines 23 a measurement to slave computer SL. This data is then relayed through buffer 14 to intermediate computer 30 (FIG. 2). Intermediate computer 30 then retransmits this information to master computer MC (FIG. 1) which may then display the measurement. Thereafter, intermediate computer returns to step 52 and awaits further instructions.

In the event that master computer is being used to perform troubleshooting, a routine such as step 88 of branch 70 can be initiated to advance the program to a given point. First intermediate computer 30 issues an instruction to slave computer SL requiring it to execute the next one of its programming steps. Thereafter, as shown by conditional step 90, intermediate computer 30 inquires whether slave computer SL has reached the programming step designated by master computer MC. If this step is not yet reached, intermediate computer 30 returns to step 88, again requiring the slave computer to execute another programming step. Eventually, slave computer SL reaches the designated programming step and stops, intermediate computer 30 then returning through trunk line 84 to step 52 to await further instructions.

Alternatively, master computer MC may issue an instruction for slave computer SL to advance a single increment in its program. In this case, branch 80 will be entered, causing step 92 to be executed. In this step, intermediate computer 30 will transmit through buffer 14 to slave computer SL, a command to execute the next one of its programming steps and then halt. Thereafter, intermediate computer 30 returns to program step 52 where it awaits further instructions from master computer MC.

It is to be appreciated that various modifications may be implemented with respect to the above described preferred method. For example, certain branches in the program may be deleted and others may be added, depending upon the specific test and troubleshooting requirements. Also, certain routines may be performed according to a hierarchy, that is, only after a higher priority routine has been completed. It is expected that the cycle time of the program may vary depending upon the speed and capacity of the microcomputer employed.

Obviously, many modifications and variations of the present invention are possible in light of the above teachings. It is therefore to be understood that within the scope of the appended claims, the invention may be practiced otherwise than as specifically described.

What is claimed is:

1. A method of testing a unit with a test instrument and with the aid of a master, an intermediate and a slave computer, the latter being connected to said test instrument for sensing its measurements, comprising the steps of:

dispatching one of a plurality of instruction signals to said intermediate computer from said master computer;

issuing to said slave computer, when it is not halted, a signal to halt from said intermediate computer after receipt by the latter of one of said instruction signals, said signal to halt being provided in response to one of said instruction signals;

transmitting from said intermediate to said slave computer, after the latter has halted, that one of a plurality of command signals corresponding to the currently received one of said instruction signals;

altering the state of said slave computer in response to that one of said command signals transmitted from said intermediate computer, the altering of the state of said slave computer being directed by said master computer without any change in direction originating from said intermediate computer;

forwarding a go signal to said intermediate computer from said master computer;

issuing to said slave computer from said intermediate computer a run signal signifying a request to run and sense measurements from said test instrument; and performing successive measurements with said slave computer without successive authorization through said intermediate computer.

2. A method according to claim 1 further including the step of:

relaying through said intermediate computer to said master computer a selected datum stored in said slave computer after receipt by the latter of a predetermined one of said command signals.

3. A method according to claim 2 further including the step of:

altering a given datum stored in said slave computer after receipt by it of a corresponding one of said command signals, originating in response to one of said instruction signals of said master computer.

4. A method according to claim 1, 2 or 3, wherein said intermediate computer is operable to transmit a diagnostic one of said command signals, further comprising the steps of:

operating and sensing of said instrument by said slave computer before receipt of said run signal and in response to receipt of said diagnostic one of said command signals; and transmitting through said intermediate computer to said master computer, information from said instrument sensed by said slave computer.

5. A method according to claim 3, wherein said intermediate computer is operable to transmit an incrementing one of said command signals, further comprising the step of:

executing a single programming step of said slave computer and stopping in response to said incrementing one of said command signals.

6. A method according to claim 3, wherein said intermediate computer transmits an indexing one of said command signals, further comprising the step of:

executing a succession of programming steps of said slave computer until reaching a step specified by said indexing one of said command signals.

7. A method according to claim 1, wherein said instrument comprises a plurality of measuring devices and a plurality of stimulative devices, said slave computer in response to said run signal thereafter operating said stimulative and said measuring devices according to a preprogrammed pattern to diagnose said unit independently of said master and intermediate computer.

8. A method according to claim 7, wherein said intermediate computer is operable to transmit an encoded, diagnostic one of said command signals, further comprising the step of:

decoding said diagnostic one of said command signals with said slave computer to select one of said measuring and stimulative devices; and operating the selected one of said measuring and stimulative devices with said slave computer.

9. A method of testing a unit with a test instrument and with the aid of a master, an intermediate and a slave computer, the latter being connected to said test instrument for sensing its measurements, comprising the steps of:

dispatching an instruction signal to said intermediate computer from said master computer;

sensing whether said slave computer is halted and providing information to said intermediate computer indicating whether said slave has halted;

halting said slave computer through a halt command transmitted by said intermediate computer; and decoding said instruction signal with said intermediate computer to direct it into one of a plurality of routines, one of said routines causing the intermediate computer to direct the slave computer to run its current program for operating said instrument, another one of said routines causing the intermediate computer to relay data from said slave to said master computer.

10. A method according to claim 10, wherein said another one of said routines causes transmission to said intermediate computer from said slave computer part of its memory data.

11. A method according to claim 10, wherein said another one of said routines causes the said slave computer to perform a measurement with said test instrument and relay its measurement to said intermediate computer.

12. A method of testing a unit with a test instrument and with the aid of an intermediate and a slave computer, the latter being connected to said test instrument for sensing its measurements, comprising the steps of:

dispatching one of a plurality of instruction signals to said intermediate computer, said dispatching occurring in response to manual intervention by an operator; and transmitting from said intermediate to said slave computer that one of a plurality of command signals corresponding to the currently received one of said instruction signals, said command signals including singular requests for said slave computer to: a. operate said test instrument, b. stop after executing one programming instruction and c. return a signal corresponding to the data stored at a selected memory location in said slave computer.

* * * * *